United States Patent
Chen et al.

(10) Patent No.: US 6,680,261 B2
(45) Date of Patent: Jan. 20, 2004

(54) METHOD OF REDUCING BORON OUTGASSING AT TRENCH POWER IC'S OXIDATION PROCESS FOR SACRIFICIAL OXIDE LAYER

(75) Inventors: Jen-Te Chen, Hsinchu (TW); Kou-Liang Jaw, Hsinchu (TW); Mao-Song Tseng, Hsinchu (TW); Kou-Wei Yang, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/133,087

(22) Filed: Apr. 25, 2002

(65) Prior Publication Data
US 2003/0054665 A1 Mar. 20, 2003

(30) Foreign Application Priority Data
May 2, 2001 (TW) ........................................ 90110463 A

(51) Int. Cl.⁷ ........................ H01L 21/31; H01L 21/469
(52) U.S. Cl. ........................................................ 438/770
(58) Field of Search ................................... 438/770, 769, 438/775, 787, 791

(56) References Cited

U.S. PATENT DOCUMENTS 6,040,216 A * 3/2000 Sung ........................... 438/257
6,498,079 B1 * 12/2002 Bryant et al. ................ 438/542

OTHER PUBLICATIONS

Coating for Ultra High Voltage Pyrex Viewports to Prevent Boron Outgassing, IBM Tech. Disclosure Bulletin, Oct. 1994, Vol 37, No. 10, pp. 457–458.*

* cited by examiner

Primary Examiner—Craig A. Thompson
(74) Attorney, Agent, or Firm—Townsend and Townsend and Crew LLP

(57) ABSTRACT

Embodiments of the present invention are directed to a method of reducing boron outgassing at trench power IC's oxidation process for the sacrificial oxide layer whereby the threshold voltage of the power ICs can be improved and the yield of the product can be enhanced. Nitrogen is introduced into the furnace in the entire oxidation process, including the main oxidation steps. In the preparing step of ramp up, the ramp up step and the stable step, prior to the main oxidation, nitrogen is introduced in a sufficient flow rate to make the environment near the saturated vapor pressure to reduce boron outgassing at the trench.

26 Claims, 1 Drawing Sheet

METHOD OF REDUCING BORON OUTGASSING AT TRENCH POWER IC'S OXIDATION PROCESS FOR SACRIFICIAL OXIDE LAYER

CROSS-REFERENCES TO RELATED APPLICATIONS

This application claims priority from R.O.C. Patent Application No. 090110463, filed May 2, 2001, the entire disclosure of which is incorporated herein by reference.

BACKGROUND OF THE INVENTION

FIG. 1 shows a cross-section of a general N-type power IC, the fabrication method of which is described herein. An oxide layer is formed on the N-type substrate 10. A patterned photoresist layer is formed on the oxide layer to define an active region. P type dopants are implanted into the substrate 10. After the drive-in process is proceeded, a P⁻type body 12 is formed in the active region. Then the photoresist layer is removed, and another photoresist layer is formed to define the gate area. Etching is conducted to form a trench 14 in the substrate 10. After removing the photoresist layer and before forming a gate oxide layer 16, a sacrificial layer is formed on the surface of the trench with an oxidation process conducted in a furnace. The sacrificial layer is removed. The gate oxide layer 16 is formed and a polysilicon layer acting as a gate 18 is formed in the trench. A patterned photoresist layer is then formed to define source/drain regions, and an implantation and RTA are sequentially performed to form the N⁺type source 20 at one side of the gate 18. A BPSG layer 22 is deposited with a contact window therein, and P type dopants are implanted to form a P⁺ type region 24.

The oxidation process of the sacrificial oxide layer, formed before forming the gate oxide layer 16, is given here.

| | Temperature | Flow rate of $N_2$ | Flow rate of $O_2$ | Required time |
|---|---|---|---|---|
| Step 1 | 900° C. | 6 sccm | 0 sccm | |
| Step 2 | 900° C. | 9 sccm | 0 sccm | |
| Step 3 | 900° C. | 12 sccm | 0.6 sccm | 10 min |
| Step 4 | Ramp up 5° C./min | 12 sccm | 0.6 sccm | |
| Step 5 | 1150° C. | 12 sccm | 0.6 sccm | 10 min |
| Step 6 | 1150° C. | 0 sccm | 12 sccm | 5 min |
| Step 7 | 1150° C. | 0 sccm | 12 sccm | 21 min |
| Step 8 | 1150° C. | 0 sccm | 12 sccm | 5 min |
| Step 9 | 1150° C. | 12 sccm | 0 sccm | 10 min |
| Step 10 | Ramp down 3° C./min | 12 sccm | 0 sccm | |
| Step 11 | 900° C. | 9 sccm | 0 sccm | |
| Step 12 | 900° C. | 6 sccm | 0 sccm | |

The main oxidation steps are steps 6~8 after the furnace temperature reaches the oxidation temperature. In these oxidation steps, the flow rate of $O_2$ increases and reaches 12 sccm, and the flow of $N_2$ is interrupted. However, after analyzing the electric properties of the power IC, it is found that the threshold voltage of the power IC is too low and the difference of standard error is very large. This is because the boron is outgassing in these main oxidation steps and the impurities in the environment diffuse into the sacrificial oxide layer to induce dislocation in the substrate. Therefore, the concentration of boron near the surface of the trench is non-uniform. Furthermore, the location of the wafer in the furnace affects the threshold voltage of the power ICs so that the threshold voltage of the power ICs cannot be effectively controlled in the demanded range, so the power ICs belong to a different batch.

BRIEF SUMMARY OF THE INVENTION

Embodiments of the present invention are directed to a method of reducing boron outgassing at trench power IC's oxidation process for the sacrificial oxide layer whereby the threshold voltage of the power ICs can be improved and the yield of the product can be enhanced.

It is another feature of the present invention to prevent the impurities in the environment from diffusing into the sacrificial oxide layer, and the dislocation in the substrate can thus be reduced.

Yet another feature of the invention is to provide a new oxidation process for sacrificial oxide layer, so the threshold voltage of the power ICs can be controlled in the demanded range, no matter to which batch the power ICs belong and no matter in which zone the wafer is located in the furnace.

An aspect of the present invention is directed to a method of reducing boron outgassing at a trench of a trenched substrate of a power IC during an oxidation process for a sacrificial oxide layer. The method comprises placing the trenched substrate in a furnace; raising a temperature of the furnace to the oxidation temperature; and introducing nitrogen and oxygen into the furnace for main oxidation when the temperature of the furnace reaches the oxidation temperature. The nitrogen is sufficient in concentration in the furnace at the oxidation temperature to reduce boron outgassing at the trench.

In some embodiments, the oxidation temperature is about 1150° C. The nitrogen comprises N2. The flow rate of the nitrogen is about 8–20 sccm. Transdichloroethylene (TLC) is introduced into the furnace during the main oxidation after the temperature in the furnace reaches the oxidation temperature. The TLC is introduced after flow rates of the nitrogen and oxygen for the main oxidation are stable. For example, the TLC may be introduced at about 5 minutes after the nitrogen and oxygen for the main oxidation are introduced into the furnace to reach stable flow rates.

In specific embodiments, prior to raising the temperature of the furnace to the oxidation temperature, the furnace is prepared by introducing nitrogen into the furnace at a preparation flow rate which is sufficiently high to make the furnace near a saturated vapor pressure. The temperature of the furnace is ramped up to the oxidation temperature after preparing the furnace. After the temperature in the furnace is ramped up to the oxidation temperature and prior to introducing the nitrogen and oxygen into the furnace for main oxidation, the furnace is stabilized by maintaining the flow rate of the nitrogen at the preparation flow rates. Preparing the furnace may comprise introducing oxygen into the furnace at a preparation flow rate which is substantially lower than the flow rate of the oxygen during the main oxidation. Stabilizing the furnace may comprise maintaining the flow rate of the oxygen at the preparation flow rate. The preparation flow rate of the nitrogen may be about 12–18 sccm. A silicon nitride layer is formed during the main oxidation.

Another aspect of the present invention is directed to a method of reducing boron outgassing at a trench of a trenched substrate of a power IC during an oxidation process for a sacrificial oxide layer. The method comprises placing the trenched substrate in a furnace; preparing the furnace by introducing nitrogen into the furnace at a preparation flow rate which is sufficient to make the furnace near a saturated vapor pressure; ramping up a temperature of the furnace to an oxidation temperature while maintaining the flow rate of the nitrogen into the furnace at the preparation flow rate to make the furnace near the saturated vapor pressure; stabilizing the furnace by maintaining temperature of the furnace at the oxidation temperature and maintaining the flow rate of the nitrogen at the preparation flow rate to make the furnace near the saturated vapor pressure; and performing main oxidation of the trenched substrate by introducing nitrogen into the furnace at a main oxidation flow rate and introducing oxygen into the furnace at a sufficient flow rate for main oxidation.

In some embodiments, the preparation flow rate of nitrogen is about 12–18 sccm. The oxidation temperature is about 1150° C. The main oxidation flow rate of nitrogen is about 8–20 sccm. The flow rate of oxygen during the main oxidation is about 12 sccm. TLC may be introduced into the furnace during the main oxidation, after the flow rates of the nitrogen and oxygen for main oxidation are stable, until substantially all impurities are trapped. A silicon nitride layer is formed during the main oxidation.

In accordance with another aspect of the invention, a power IC comprises a substrate, and a gate structure overlying a silicon nitride layer formed in a trench of the substrate during main oxidation of the substrate.

DETAILED DESCRIPTION OF THE INVENTION

Figure 1:
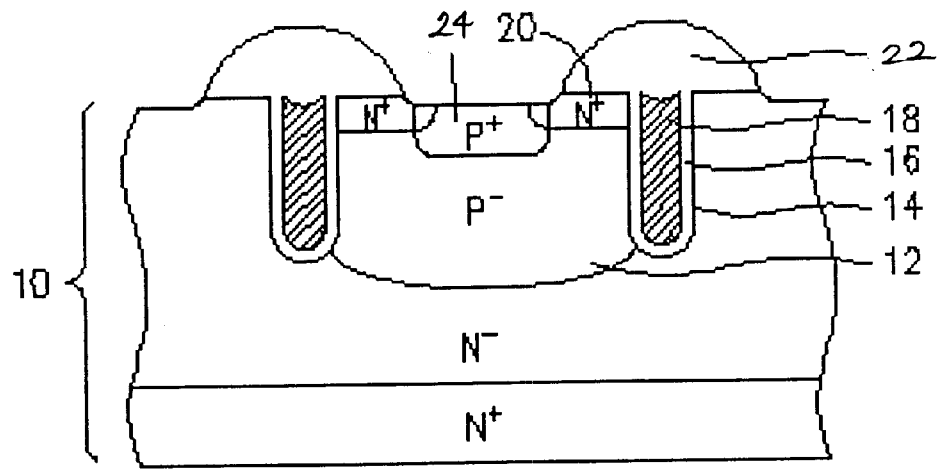
FIG. 1 is a cross-section of a typical power IC.
Figure 2:
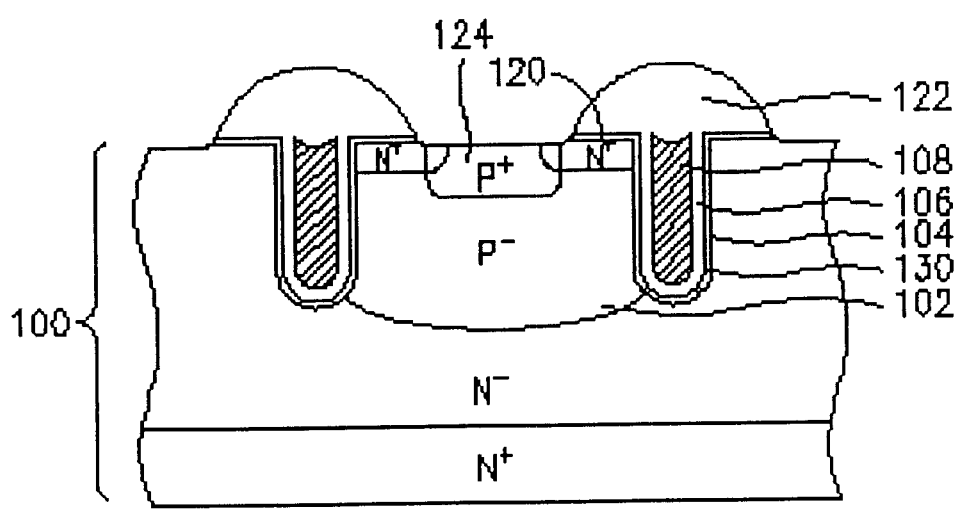
FIG. 2 is a cross-section of a power IC according to an embodiment of the present invention.

FIG. 2 shows a cross-section of a power IC according to an embodiment of the present invention. Its fabrication method is described here.

An oxide layer is formed on the N⁻ type substrate 100. A patterned photoresist layer is formed on the oxide layer to define an active region. P type dopants are implanted into the substrate 100. After the drive-in process is proceeded, a P⁻ type body 102 is formed in the active region. Then the photoresist layer is removed, and another photoresist layer is formed to define the gate area. Etching is conducted to form a trench 104 in the substrate 100. After removing the photoresist layer and before forming a gate oxide layer 106, oxidation is conducted in the furnace so as to form a thin silicon nitride layer 130 on the surface of trench and to form a sacrificial layer thereon. The sacrificial layer is then removed. The gate oxide layer 106 is formed and a polysilicon layer acting as a gate 108 is formed in the trench. Then a patterned photoresist layer is formed to define source/drain regions, and an implantation and RTA are sequentially performed to form the N⁺ type source 120 at one side of the gate 108. A BPSG layer 122 is deposited with a contact window, and P type dopants are implanted to form a P⁺ type region 124.

The oxidation process for preventing the boron from out-gassing is given here. Any suitable furnace can be used. The internal volume of the furnace is typically about 42–70 l in size, and the furnace used in the experiments has an internal volume of about 42 l.

|  |  | Temperature | Flow rate of $N_2$ | Flow rate of $O_2$ | TLC | Required time |
|---|---|---|---|---|---|---|
| Standby step | Step 1 | 900° C. | 6 sccm | 0 sccm | — | |
|  | Step 2 | 900° C. | 9 sccm | 0 sccm | — | |
| Preparing step of ramp up | Step 3 | 900° C. | 12~18 sccm | 0.6 sccm | — | 10 min |
| Ramp up step | Step 4 | Ramp up 5° C./min | 12~18 sccm | 0.6 sccm | — | |
| Stable step | Step 5 | 1150° C. | 12~18 sccm | 0.6 sccm | — | 10 min |
| Main oxidation step | Step 6 | 1150° C. | 8~20 sccm | 12 sccm | — | 5 min |
|  | Step 7 | 1150° C. | 8~20 sccm | 12 sccm | 0.2 L | 21 min |
|  | Step 8 | 1150° C. | 8~20 sccm | 12 sccm | — | 5 min |
|  | Step 9 | 1150° C. | 12~18 sccm | 0 sccm | — | 10 min |
| Ramp down step | Step 10 | Ramp down 3° C./min | 12~18 sccm | 0 sccm | — | |
|  | Step 11 | 900° C. | 9 sccm | 0 sccm | — | |
|  | Step 12 | 900° C. | 6 sccm | 0 sccm | — | |

In the ramp up step (step 4) and its forward and next steps (steps 3 and 5), and the ramp down step (step 10) and its forward step (step 9), the flow rates of $N_2$ are higher, about 12~18 sccm. The purpose of inducing higher concentration and higher degree of purity of $N_2$ in the ramp up step is to make the environment near saturated vapor pressure to prevent the boron outgassing. The thin silicon nitride layer 130 is formed to further reduce the outgassing of boron.

In the main oxidation steps (steps 6~8), the temperature maintains a specific oxidation temperature, about 1150° C., $O_2$ is sufficient, and the $N_2$ keeps on flowing with a flow rate of 8~20 sccm. Therefore, the thin silicon nitride layer 130 is formed in the main oxidation steps. The density of the silicon nitride layer 130 is higher so that the diffusion of boron can be reduced. Moreover, due to the existence of the higher concentration of $N_2$, the chance of the impurities diffusing into the sacrificial oxide layer in the high temperature to induce dislocation in the substrate is reduced. Then, the concentration of boron near the surface of the trench is uniform and the threshold voltage of the power ICs is kept under control. Further, the higher concentration of $N_2$ can reduce the diffusion of boron.

In step 7, TLC is introduced to trap sodium ions and potassium ions so as to stabilize the oxide film.

After the power IC is treated with the above-mentioned oxidation process, the threshold voltage of the power ICs can be controlled in the demanded range and has no relationship with which batch the power ICs belong to and in which zone the wafer is located in the furnace. The threshold voltage is, therefore, enhanced.

With repeated experiments it was found that the threshold voltage has a relationship with the flow rate of $N_2$. If the flow rate of $N_2$ is increased, the threshold voltage is increased. Thus the flow rate of $N_2$ in the main oxidation steps (steps 6–8) can be altered based on the demanded threshold voltage.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method of reducing boron outgassing at a trench of a trenched substrate of a power IC during an oxidation process for a sacrificial oxide layer, the method comprising:
   placing the trenched substrate in a furnace;
   raising a temperature of the furnace to the oxidation temperature; and
   introducing nitrogen and oxygen in gaseous form into the furnace for main oxidation of the sacrificial oxide layer in the trench of the trenched substrate when the temperature of the furnace reaches the oxidation temperature, the nitrogen being sufficient in concentration in the furnace at the oxidation temperature to reduce boron outgassing at the trench.

2. The method of claim 1 wherein the oxidation temperature is about 1150° C.

3. The method of claim 1 wherein the nitrogen comprises $N_2$.

4. The method of claim 1 wherein the flow rate of the nitrogen is about 8–20 sccm.

5. The method of claim 1 further comprising introducing TLC into the furnace during the main oxidation after the temperature in the furnace reaches the oxidation temperature.

6. The method of claim 5 wherein the TLC is introduced after flow rates of the nitrogen and oxygen for the main oxidation are stable.

7. A method of reducing boron outgassing at a trench of a trenched substrate of a power IC during an oxidation process for a sacrificial oxide layer, the method comprising:
   placing the trenched substrate in a furnace;
   preparing the furnace by introducing nitrogen in vapor form into the furnace at a preparation flow rate which is sufficiently high to make the furnace near a saturated vapor pressure;
   raising a temperature of the furnace to the oxidation temperature; and
   introducing nitrogen and oxygen in vapor form into the furnace for main (oxidation when the temperature of the furnace reaches the oxidation temperature, the nitrogen being sufficient in concentration in the furnace at the oxidation temperature to reduce boron outgassing at the trench.

8. The method of claim 7 wherein the temperature of the furnace is ramped up to the oxidation temperature after preparing the furnace.

9. The method of claim 8 further comprising, after the temperature in the furnace is ramped up to the oxidation temperature and prior to introducing the nitrogen and oxygen in vapor form into the furnace for main oxidation, stabilizing the furnace by maintaining the flow rate of the nitrogen at the preparation flow rates.

10. The method of claim 9 wherein preparing the furnace comprises introducing oxygen in vapor form into the furnace at a preparation flow rate which is substantially lower than the flow rate of the oxygen during the main oxidation, and wherein stabilizing the furnace comprises maintaining the flow rate of the oxygen at the preparation flow rate.

11. The method of claim 7 wherein the preparation flow rate of the nitrogen is about 12–18 sccm.

12. The method of claim 1 wherein a silicon nitride layer is formed during the main oxidation.

13. The method of claim 1 wherein raising the temperature of the furnace to the oxidation temperature further comprises:
   preparing the furnace by introducing nitrogen into the furnace at a preparation flow rate which is sufficient to make the furnace near a saturated vapor pressure;
   ramping up a temperature of the furnace to an oxidation temperature while maintaining the flow rate of the nitrogen into the furnace at the preparation flow rate to make the furnace near the saturated vapor pressure; and
   stabilizing the furnace by maintaining temperature of the furnace at the oxidation temperature and maintaining the flow rate of the nitrogen at the preparation flow rate to make the furnace near the saturated vapor pressure.

14. The method of claim 13 wherein the preparation flow rate of nitrogen is about 12–18 sccm.

15. The method of claim 13 wherein the oxidation temperature is about 1150° C.

16. The method of claim 13 wherein the flow rate of nitrogen for main oxidation is about 8–20 sccm.

17. The method of claim 13 wherein the flow rate of oxygen for main oxidation is about 12 sccm.

18. The method of claim 13 further comprising introducing TLC into the furnace during the main oxidation, after the flow rates of the nitrogen and oxygen for main oxidation are stable, until substantially all impurities are trapped.

19. The method of claim 13 wherein a silicon nitride layer is formed during the main oxidation.

20. A method of reducing boron outgassing at a trench of a trenched substrate of a power IC during an oxidation process for a sacrificial oxide layer, the method comprising:
   placing the trenched substrate in a furnace;
   raising a temperature of the furnace to the oxidation temperature; and introducing nitrogen and oxygen into the furnace for main oxidation when the temperature of the furnace reaches the oxidation temperature, the nitrogen being sufficient in concentration in the furnace at the oxidation temperature to reduce boron outgassing at the trench further comprising introducing transdichloroethylene (TLC) into the furnace during the main oxidation after the temperature in the furnace reaches the oxidation temperature.

21. The method of claim 20 wherein the TLC is introduced after flow rates of the nitrogen and oxygen for the main oxidation are stable.

22. A method of reducing boron outgassing at a trench of a trenched substrate of a power IC during an oxidation process for a sacrificial oxide layer, the method comprising:

placing the trenched substrate in a furnace;

raising a temperature of the furnace to the oxidation temperature; and introducing nitrogen and oxygen in gaseous form into the furnace to form a silicon nitride layer in the trench of the trenched substrate during main oxidation of the sacrificial oxide layer, the silicon nitride layer in the trench reducing boron outgassing at the trench.

23. The method of claim 22 wherein the oxidation temperature is about 1150° C.

24. The method of claim 22 wherein the nitrogen comprises $N_2$.

25. The method of claim 22 further comprising introducing transdichloroethylene (TLC) into the furnace during the main oxidation after the temperature in the furnace reaches the oxidation temperature.

26. The method of claim 25 wherein the TLC is introduced after flow rates of the nitrogen and oxygen for the main oxidation are stable.

* * * * *